United States Patent
Izumi et al.

(10) Patent No.: US 7,781,946 B2
(45) Date of Patent: Aug. 24, 2010

(54) PIEZOELECTRIC ELEMENT, INK JET RECORDING HEAD AND INK JET PRINTER

(75) Inventors: Hideto Izumi, Chino (JP); Masao Nakayama, Chino (JP)

(73) Assignee: Seiko Epson Corporation, Tokyo (JP)

( * ) Notice: Subject to any disclaimer, the term of this patent is extended or adjusted under 35 U.S.C. 154(b) by 190 days.

(21) Appl. No.: 12/047,850

(22) Filed: Mar. 13, 2008

(65) Prior Publication Data

US 2008/0231146 A1    Sep. 25, 2008

(30) Foreign Application Priority Data

Mar. 20, 2007   (JP) .............................. 2007-072963

(51) Int. Cl.
   *H01L 41/08*    (2006.01)
   *B41J 2/045*    (2006.01)
(52) U.S. Cl. .................. 310/365; 310/367; 347/68; 347/70; 347/71; 347/72
(58) Field of Classification Search ................ 310/365, 310/367; 347/68–72
   See application file for complete search history.

(56) References Cited

U.S. PATENT DOCUMENTS

| | | | |
|---|---|---|---|
| 6,817,073 B2 * | 11/2004 | Uchiyama et al. | 29/25.35 |
| 7,501,739 B2 * | 3/2009 | Itaya et al. | 310/320 |
| 2006/0001508 A1 * | 1/2006 | Ohara et al. | 333/191 |
| 2006/0170308 A1 * | 8/2006 | Eggs et al. | 310/322 |
| 2007/0048880 A1 * | 3/2007 | Kobayashi et al. | 438/3 |
| 2007/0115078 A1 * | 5/2007 | Sano et al. | 333/187 |
| 2008/0012911 A1 * | 1/2008 | Takabe et al. | 347/70 |
| 2008/0239017 A1 * | 10/2008 | Takabe et al. | 347/68 |
| 2009/0033177 A1 * | 2/2009 | Itaya et al. | 310/335 |
| 2009/0093070 A1 | 4/2009 | Kobayashi et al. | |
| 2009/0153625 A1 | 6/2009 | Kobayashi et al. | |

FOREIGN PATENT DOCUMENTS

| | | | |
|---|---|---|---|
| JP | 11-078002 | * | 3/1999 |
| JP | A-2000-85124 | | 3/2000 |
| JP | A-2003-243625 | | 8/2003 |
| JP | 2003-298022 | * | 10/2003 |
| JP | A-2006-224348 | | 8/2006 |
| JP | A-2007-59705 | | 3/2007 |

* cited by examiner

*Primary Examiner*—Thomas M Dougherty
(74) *Attorney, Agent, or Firm*—Workman Nydegger

(57) ABSTRACT

A piezoelectric element includes: a base substrate; a lower electrode formed above the base substrate; a ferroelectric layer formed above the lower electrode; and an upper electrode formed above the ferroelectric layer, wherein an angle of a corner defined by a side surface of the ferroelectric layer and a top surface of the base substrate is between 45° and 75°.

6 Claims, 5 Drawing Sheets

PIEZOELECTRIC ELEMENT, INK JET RECORDING HEAD AND INK JET PRINTER

The entire disclosure of Japanese Patent Application No. 2007-072963, filed Mar. 20, 2007 is expressly incorporated by reference herein.

BACKGROUND

1. Technical Field

The present invention relates to piezoelectric elements, ink jet recording heads and ink jet printers.

2. Related Art

Piezoelectric elements including ferroelectric layers can function as actuators, and therefore are widely applicable to a variety of devices, such as, liquid jet heads of ink jet printers, gyro sensors and the like. When piezoelectric elements are used as liquid jet heads, a greater amount of displacement in the ferroelectric layer leads to an increased amount of liquid ejection. Also, piezoelectric elements may have a capacitor structure in which a ferroelectric layer is interposed between a lower electrode and an upper electrode. By arranging such capacitor structures with high density, high resolution images can be printed.

For manufacturing piezoelectric elements which can attain a large amount of displacement and are arranged with high density, highly accurate film forming process and patterning process are indispensable. However, these processes may cause damage to the ferroelectric layers, which results in an increased leakage current. To control such a leakage current, for example, JP-A-2003-243625 describes a method to protect a dielectric film by providing a barrier layer.

SUMMARY

In accordance with an advantage of some aspects of the invention, it is possible to provide piezoelectric elements that can attain a favorable amount of displacement and control leakage currents, ink jet recording heads and ink jet printers.

A piezoelectric element in accordance with an embodiment of the invention includes: a base substrate; a lower electrode formed above the base substrate; a ferroelectric layer formed above the lower electrode, and above a portion of an area of the base substrate; and an upper electrode formed above the ferroelectric layer, wherein an angle of a corner defined by a side surface of the ferroelectric layer and a top surface of the base substrate is between 45° and 75°.

In the piezoelectric element in accordance with an aspect of the embodiment, the ferroelectric layer may be formed only above a portion of a region of the lower electrode.

In the piezoelectric element in accordance with an aspect of the embodiment, the angle of a corner defined by the side surface of the ferroelectric layer and a top surface of the lower electrode may between 45° and 75°.

The piezoelectric element in accordance with an aspect of the embodiment may further include a protection film that covers at least the side surface of the ferroelectric layer.

In piezoelectric element in accordance with an aspect of the embodiment, the protection film may be composed of silicon oxide or aluminum oxide.

In piezoelectric element in accordance with an aspect of the embodiment, the ferroelectric layer may be formed in contact with the top surface of the base substrate and the top surface of the lower electrode, the lower electrode has an end section that is covered by a ferroelectric layer, and an angle $\theta_1$ of a corner defined by the side surface of the ferroelectric layer and the top surface of the base substrate and an angle $\theta_2$ of a corner defined by the side surface of the ferroelectric layer and the top surface of the lower electrode are both between 45° and 75°.

In piezoelectric element in accordance with an aspect of the embodiment, the angle $\theta_1$ may be greater than the angle $\theta_2$ ($\theta_1 > \theta_2$).

In piezoelectric element in accordance with an aspect of the embodiment, the piezoelectric layer may include lead zirconate titanate.

An ink jet recording head in accordance with an embodiment of the invention includes any one of the piezoelectric elements described above.

An ink jet printer in accordance with an embodiment of the invention includes the ink jet recording head described above.

DESCRIPTION OF EXEMPLARY EMBODIMENTS

Preferred embodiments of the invention are described below with reference to the accompanying drawings.

1. Piezoelectric Element

Figure 1:
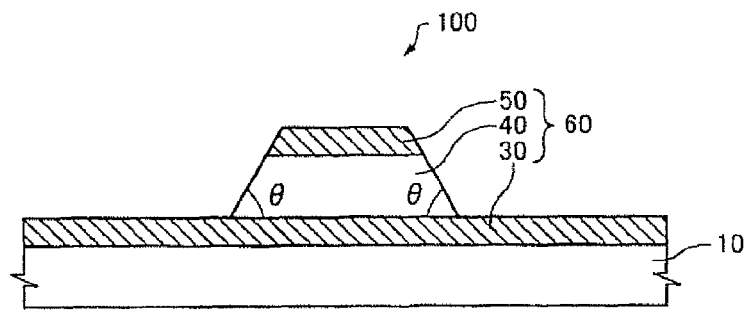
FIG. 1 is a schematic cross-sectional view of a piezoelectric element 100 in accordance with an embodiment of the invention.

A piezoelectric element 100 in accordance with an embodiment of the invention is described. FIG. 1 is a schematic cross-sectional view of the piezoelectric element 100 in accordance with the embodiment. The piezoelectric element 100 in accordance with the present embodiment includes a base substrate 10, a lower electrode 30, a ferroelectric layer 40 and an upper electrode 50. The lower electrode 30, the ferroelectric layer 40 and the upper electrode 50 form a capacitor structure 60.

The base substrate 10 may be a substrate, or a layer in which a single layer film or a multilayer film formed on a substrate. The base substrate 10 may include a silicon layer, or an inorganic oxide layer such as a silicon oxide layer, a zirconium oxide layer and the like. Also the base substrate 10 may include a layer that functions as an elastic plate.

The lower electrode 30 is formed at least in a portion of the area of the top surface of the base substrate. The ferroelectric layer 40 is formed at least in a portion of the area of the top surface of the lower electrode 30. More specifically, as shown in FIG. 1, the ferroelectric layer 40 is formed such that its end section is positioned on the top surface of the lower electrode 30. At the end section, an angle of inclination θ defined between a side surface of the ferroelectric layer 40 and the top surface of the lower electrode 30 may preferably be between 45° and 75°.

If the angle of inclination θ is less than 45°, the amount of displacement in the ferroelectric layer 40 may become insufficient, and if the angle of inclination θ is greater than 75°, leakage currents would not be suppressed. Its details are described below in conjunction with experimental examples.

The upper electrode 50 is formed above the ferroelectric layer 40. At an end section of the upper electrode 50, an angle of inclination defined between a top surface of the ferroelectric layer 40 and a side surface of the upper electrode 50 may be the same as the angle of inclination θ described above, or may be greater than the angle of inclination θ.

As the material for the lower electrode 30, for example, a variety of metals, such as, nickel, iridium and platinum, their conductive oxides (for example, iridium oxide), composite oxides, such as, $SrRuO_3$, $LaNiO_3$ and the like may be used without any particular limitation. Also, the lower electrode 30 may be in a single layer of any of the materials exemplified above, or have a structure in which a plurality of materials are laminated in layers.

As the material for the ferroelectric layer 40, for example, a perovskite type oxide expressed by a general formula $ABO_3$ (where A includes lead (Pb), and B includes zirconium (Zr) and titanium (Ti) may preferably be used. Above all, lead zirconate titanate (PZT) and lead zirconate titanate niobate (PZTN) are preferred, as these materials exhibit good piezoelectric characteristics. Also, composite oxide of barium, strontium and titanium (BST) and composite oxide of strontium, bismuth and tantalum (SBT) are suitable, as these materials exhibit ferroelectric characteristics.

As the material for the upper electrode 50, for example, a variety of metals, such as, nickel, iridium and platinum, their conductive oxides (for example, iridium oxide), composite oxides, such as, $SrRuO_3$, $LaNiO_3$ and the like may be used without any particular limitation. Also, the upper electrode 50 may be in a single layer of any of the materials exemplified above, or have a structure in which layers of multiple materials are laminated.

2. Method for Manufacturing Piezoelectric Element

Figure 2:
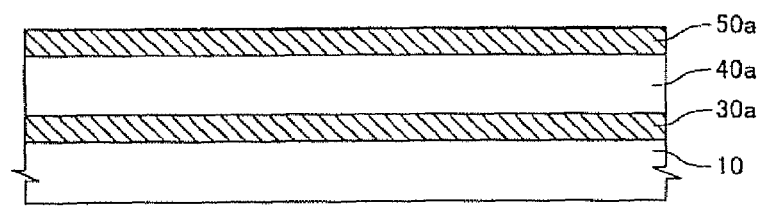
FIG. 2 is a schematic view for describing a method for manufacturing the piezoelectric element 100 in accordance with an embodiment of the invention.
Figure 3:
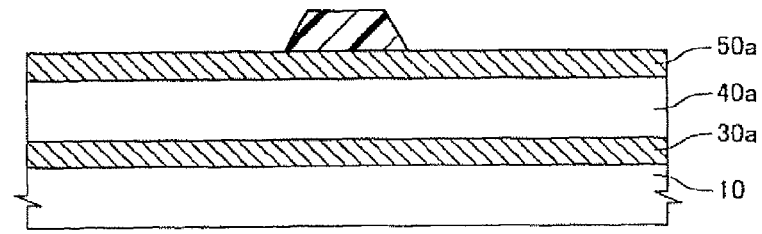
FIG. 3 is a schematic view for describing the method for manufacturing the piezoelectric element 100 in accordance with an embodiment of the invention.

Next, a method for manufacturing a piezoelectric element 100 in accordance with an embodiment of the invention is described. FIG. 2 and FIG. 3 are schematic cross-sectional views showing the method for manufacturing a piezoelectric element 100 in accordance with the embodiment.

(1) First, a base substrate 10 is prepared. Then, a lower electrode layer 30a is formed on the base substrate 10 (see FIG. 2). The lower electrode layer 30a may be formed by a known method, such as, a sputter method, a vacuum deposition method, a CVD (chemical vapor deposition) method or the like. For example, the lower electrode layer 30a may be formed from platinum by a sputter method to a thickness of, for example, 100 nm-300 nm.

(2) Next, a ferroelectric layer 40a is formed on the lower electrode layer 30a (see FIG. 2). The ferroelectric layer 40a may be formed by a liquid phase method, such as, a sol-gel method, or a metalorganic thermal coat decomposition method (MOD method), or a vapor phase method, such as, a sputter method, an ablation method, or a CVD method. As the material for the ferroelectric layer 40, an oxide containing lead, zirconium and titanium as constituent elements may preferably be used, as described above. More specifically, lead zirconate titanate (hereafter referred to as PZT) is suitable as the material for the ferroelectric layer 40a for its excellent piezoelectric property.

For example, when a sol-gel method is used, a solution in which organometallic compounds respectively containing Pb, Zr and Ti are dissolved in a solvent is coated on the base substrate 10. Then, the drying step, degreasing step, and crystallizing step are conducted, whereby a ferroelectric layer 40a is formed. A series of the steps described above may be repeated to obtain the ferroelectric layer 40a in a desired film thickness. The film thickness of the ferroelectric layer 40a may be, for example, 50 nm-1500 nm.

(3) Next, an upper electrode layer 50a is formed on the ferroelectric layer 40a. The upper electrode layer 50a may be formed by a known method, such as, a sputter method, a vacuum deposition method, a CVD method, a plating method or the like. For example, the upper electrode layer 50a may be formed from metal, such as, platinum, iridium or the like, or other oxide electrode material, such as, $LaNiO_3$, $SrRuO_3$ or the like, by a sputter method, to a thickness of 20 nm-300 nm, for example. By the steps described above, a laminate including the lower electrode layer 30a, the ferroelectric layer 40a and the upper electrode layer 50a can be obtained.

(4) Next, the lower electrode layer 30a, the ferroelectric layer 40a and the upper electrode layer 50a are patterned. An example of the patterning method is described below.

First, a resist layer R1 having a predetermined shape is formed on the upper electrode layer 50a. The resist layer R1 may be obtained by known photolithography technique (see FIG. 3). The lithography may be performed using, for example, a contact analyzer and a projection analyzer.

Figure 4:
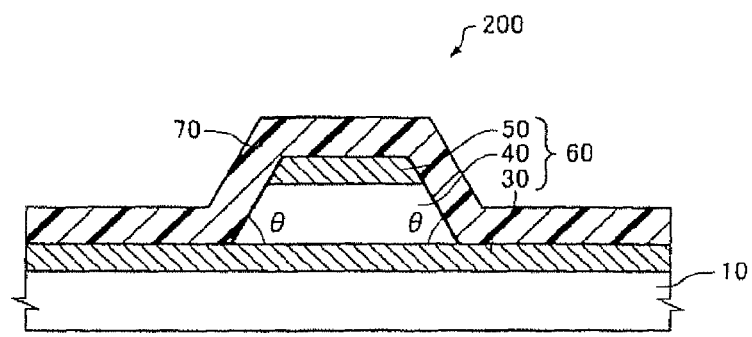
FIG. 4 is schematic cross-sectional view of a piezoelectric element 200 in accordance with a first modified example.

Then, by using the resist layer R1 as a mask, at least the upper electrode layer 50a and the ferroelectric layer 40a are dry-etched (see FIG. 4). In this step, the upper electrode layer 50a, the ferroelectric layer 40a, and the lower electrode layer 30 if necessary are etched. In accordance with the present embodiment, only the upper electrode layer 50a and the ferroelectric layer 40a are etched. As the etching method, dry etching may preferably be conducted. Above all, reactive ion etching may more preferably be used. For example, the reactive ion etching is conducted with a mixed gas of halogen gas and argon gas when patterning the upper electrode layer 50a, and with a mixed gas of halogen gas and fluorocarbon gas when patterning the ferroelectric layer 40a, and the ratio between the etching rate of the ferroelectric layer and the etching rate of the resist layer (resist selection ratio=the etching rate of the ferroelectric layer/the etching rate of the resist layer) is adjusted, whereby a desired angle of inclination can be obtained. For example, when the ferroelectric layer is formed from PZT and its thickness is 1 μm, and the film thickness of the resist is 2 μm, the angle of inclination becomes to be 55 degrees when the resist selection ratio is 1.0. When the resist selection ratio is greater than 1.0, the angle of inclination becomes to be 50 degrees or more. In reverse, when the resist selection ratio is smaller than 1.0, the angle of inclination becomes to be 50 degrees or less. Also, when the resist film thickness is increased, the angle of inclination becomes greater.

Next, the resist layer R1 is removed. The resist layer R1 may be removed by ashing using oxygen plasma. The ashing may be conducted by a known method.

By the steps described above, the ferroelectric layer 40a and the upper electrode layer 50a are patterned (see FIG. 1). It is noted that the lower electrode layer 30a may not be patterned, as described above, or may be patterned in a plane configuration different from those of the ferroelectric layer 40a and the upper electrode layer 50a. When the lower electrode layer 30a is patterned in a plane configuration different from those of the ferroelectric layer 40a and the upper electrode layer 50a, the step of forming a resist layer, the dry etching step, and the ashing step are conducted multiple times.

In this manner, a capacitor structure 60, which is formed from the lower electrode 30, the ferroelectric layer 40 and the upper electrode 50, is formed.

By the steps described above, the piezoelectric element 100 in accordance with the present embodiment can be manufactured. According to the method for manufacturing a piezoelectric element 100 in accordance with the present embodiment, the angle of inclination θ at the edge section of the ferroelectric layer 40 can be readily controlled to 45°-75°.

3. Modified Examples

Next, modified examples in accordance with the embodiment of the invention are described.

3.1. First Modified Example

A piezoelectric element 200 in accordance with the first modified example is different from the piezoelectric element 100 described above in that it further includes a protection film 70 that covers the capacitor structure 60.

FIG. 4 is a schematic cross-sectional view of the piezoelectric element 200 in accordance with the first modified example. The piezoelectric element 200 in accordance with the first modified example includes a base substrate 10, a lower electrode 30, a ferroelectric layer 40, an upper electrode 50 and a protection film 70.

Structures, materials and manufacturing methods for the base substrate 10, the lower electrode 30, the ferroelectric layer 40 and the upper electrode 50 are generally the same as those of the piezoelectric element 100 described above, and therefore their description is omitted.

The protection film 70 may cover at least an exposed surface of the ferroelectric layer 40, or may cover the entire surface of the capacitor structure 60 as shown in FIG. 4. Also, the protection film 70 may be provided with a through hole for making a contact with the upper electrode 50 or the lower electrode 30, and may be patterned in a predetermined shape.

The protection film 70 functions to protect crystals of the ferroelectric layer 40, and is capable of controlling deterioration of the piezoelectric characteristic that may be caused by oxygen deficiency by hydrogen, and moisture. As the material for the protection film 70, for example, silicon oxide, titanium nitride, titanium oxide, aluminum oxide, silicon nitride and the like may be used, and in particular, silicon oxide and aluminum oxide may preferably be used.

A method for manufacturing the piezoelectric element 200 in accordance with the first modified example is described. First, a capacitor structure 60 is formed on a base substrate 10 using the same method as the method for manufacturing the piezoelectric element 100.

Figure 5:
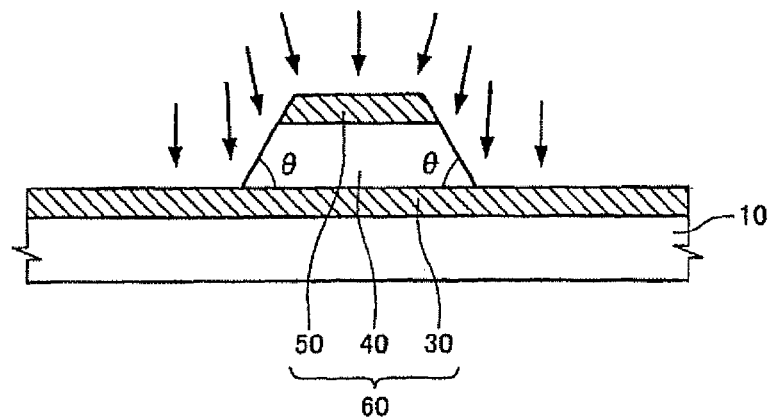
FIG. 5 a schematic view for describing a method for manufacturing the piezoelectric element 200 in accordance with an embodiment of the invention.

Then, a plasma treatment in which a RF bias is applied to the base substrate 10 is conducted, thereby contacting plasma to a side surface (exposed surface) of the ferroelectric layer 40. FIG. 5 schematically shows the state in which the plasma is contacting the exposed surface of the ferroelectric layer 40 in this step.

The plasma in the plasma treatment may be generated by a known method without any particular limitation, including a double-pole discharge type, a magnetron discharge type, and an electrodeless discharge type. Also, the use of helicon wave plasma and inductively coupled plasma (ICP) for the plasma treatment is more favorable as they are high density plasma. The plasma treatment is conducted with a RF bias being applied to the side of the substrate 10. An application of even a small RF bias to the substrate 10 results in favorable plasma treatment. By applying an RF bias to the substrate 10, more plasma particles are drawn in the substrate 10.

As the gas to be introduced into the chamber for generating plasma, it is preferable to use gas with which etching on the ferroelectric layer 40 would not preferentially occur. Concretely, as the source gas for the plasma, oxygen, nitrogen, nitrous oxide, nitrogen trifluoride, neon, argon, and carbon tetrafluoride may be suitable. Above all, oxygen ($O_2$), nitrogen ($N_2$), nitrous oxide ($N_2O$) and neon (Ne) are particularly preferred as their etching effect to the dielectric layer 40 is low.

In this manner, by conducting the plasma treatment after formation of the capacitor structure 60, the condition of the exposed surface of the ferroelectric layer 40 can be improved. For example, residue of the electrode material and the like may adhere to the exposed surface of the ferroelectric layer 40 when dry etching is conducted in the process of forming the capacitor structure 60. Such residue can be removed by the plasma treatment. Also, when oxygen deficiencies are generated in crystals of the ferroelectric layer 40 by dry etching, the crystalline state can be recovered by the plasma treatment. Moreover, charge accumulation caused by the dry etching step can be cancelled by the plasma treatment. In this manner, the exposed surface of the ferroelectric layer 40 can be recovered to a better condition, and leakage currents can be suppressed.

Also, when the angle of inclination θ of the side surface of the ferroelectric layer 40 is 75° or less, more plasma particles drawn toward the base substrate 10 can be brought in contact with the side surface of the ferroelectric layer 40, such that the recovering effect by the plasma treatment can be improved, and the effect of suppressing leakage current can be consequently improved.

Next, a protection film 70 that covers the capacitor structure 60 is formed (see FIG. 4). The protection film 70 may be formed by a known method, including a sputter method or a CVD method, for example. The protection film 70 may preferably be formed immediately after the plasma treatment described above. By this, the surface of the capacitor structure 60 can be protected before it is deteriorated, such that deterioration of the characteristic of the piezoelectric element 20 can be prevented.

Also, by conducting the plasma treatment before forming the protection film 70, damage that may be caused during the step of forming the protection film 70 can be prevented. By this, generation of leakage currents in the piezoelectric element 200 can be suppressed.

3.2. Second Modified Example

A piezoelectric element 300 in accordance with a second modified example is different from the piezoelectric element 100 described above in that a part of a ferroelectric layer 42 is formed in a region other than the forming region of the lower electrode 32.

Figure 6:
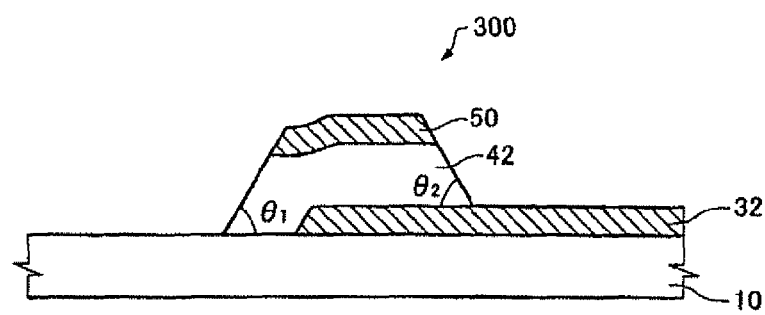
FIG. 6 is schematic cross-sectional view of a piezoelectric element 300 in accordance with a second modified example.

FIG. 6 is a schematic cross-sectional view of the piezoelectric element 300 in accordance with the third modified example. The piezoelectric element 300 in accordance with the third modified example includes a base substrate 10, a lower electrode 32, a ferroelectric layer 42 and an upper electrode 50. The lower electrode 32 is patterned in a predetermined shape, and a portion of its edge section is covered by the ferroelectric layer 42.

The ferroelectric layer 42 is formed on the base substrate 10 and the lower electrode 32. At the edge sections of the ferroelectric layer 42, the angle of inclination $θ_1$ defined between the side surface of the ferroelectric layer 42 and the top surface of the base substrate 10, and the angle of inclination $\theta_2$ defined between the side surface of the ferroelectric layer 42 and the top surface of the lower electrode 32 may be between 45° and 75°, and the angle of inclination $\theta_1$ may preferably be greater than the angle of inclination $\theta_2$ ($\theta_1 > \theta_2$). In other words, by reducing the angle of inclination $\theta_2$ of the ferroelectric layer 42 adjacent to the exposed portion of the lower electrode 32, a greater amount of plasma particles can be brought in contact with the side surface of the ferroelectric layer 42 adjacent to the exposed portion of the lower electrode 32 in the plasma treatment, which is described above in conjunction with the first modified example, and leakage currents that may be caused by conduction between the lower electrode 32 and the upper electrode 50 can be effectively reduced. Also, by making the angle of inclination $\theta_1$ in a region without current leakage greater, the capacitors can be arranged with higher density.

Other details of the structures and materials of the base substrate 10, the lower electrode 32, the ferroelectric layer 42 and the upper electrode 50 are the same as those described above. The manufacturing method is generally the same as the manufacturing method described above. As a method for setting the angles to have the relation $\theta_1 > \theta_2$, for example, when exposing the resist, the exposure light may be focused at a region where the lower electrode 32 is not formed. As there is a step difference between the region where the lower electrode 32 is not formed and the region where the lower electrode 32 is formed (see FIG. 6), the resist in the region where the lower electrode 32 is formed is formed defocused. In this case, the angle of inclination of an end section of the resist layer in the region where the resist exposure light is focused (where the lower electrode is not formed) becomes to be about 90 degrees, but the angle of inclination of an end section of the resist layer in the defocused region (where the lower electrode is formed as a base layer) becomes smaller than the above. According to the difference between these angles of inclination, the angles of inclinations of side surfaces of the ferroelectric layer to be formed by etching to be conducted later have the relation $\theta_1 > \theta_2$.

4. Experimental Examples

Samples of inkjet heads equipped with piezoelectric elements 100 in accordance with an embodiment of the invention were manufactured. In the samples, the base substrate 10 included a substrate 11 composed of a silicon layer 520 and a silicon oxide layer 14, pressure generation chambers 521, a nozzle plate 510 and an elastic layer 20. Platinum was used as the material for the lower electrode 30 and the upper electrode 50, and PZT was used as the material for the ferroelectric layer 40. The thickness of the substrate 11 was 1000 nm, the thickness of the elastic layer 20 was 400 nm, the thickness of the lower electrode 30 was 200 nm, the thickness of the ferroelectric layer 40 was 1100 nm, and the thickness of the upper electrode was 50 nm. Also, the width of the ferroelectric layer 40 was 39 μm, and the cavity width in the inkjet head was 55 μm and the cavity length was 0.57 mm.

In the inkjet head samples manufactured, the angle of inclination $\theta$ of the side surface of the ferroelectric film 40 was 35°, 45°, 65° and 85°, respectively.

Figure 7:
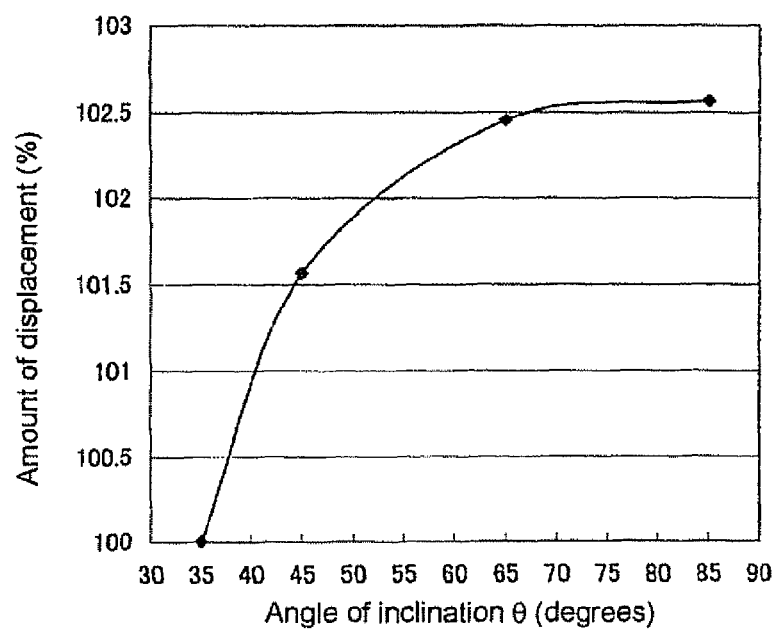
FIG. 7 shows a result of measurement of displacements in experimental examples.

The amount of displacement in the cavity using each of the inkjet heads was measured. The result is shown in FIG. 7. In the graph shown in FIG. 7, the angle of inclination $\theta$ (degrees) is plotted along an axis of abscissas, and the amount of displacement is plotted along an axis of ordinates. FIG. 7 shows normalized values in which the measured values in the samples were normalized with the amount of displacement in the sample with the angle of inclination $\theta$ at 35° as being 100.

According to FIG. 7, as the angle $\theta$ became larger, the amount of displacement increased, and especially good characteristic could be obtained when the angle $\theta$ was 45° or greater. Also, when the angle of inclination $\theta$ became 75° or greater, there was almost no change in the amount of displacement. It was confirmed from the result that the piezoelectric elements having the angle of inclination $\theta$ in the range between 45° and 75° can achieve favorable amounts of displacement according to the angles of inclination.

5. Ink Jet Recording Head

Figure 8:
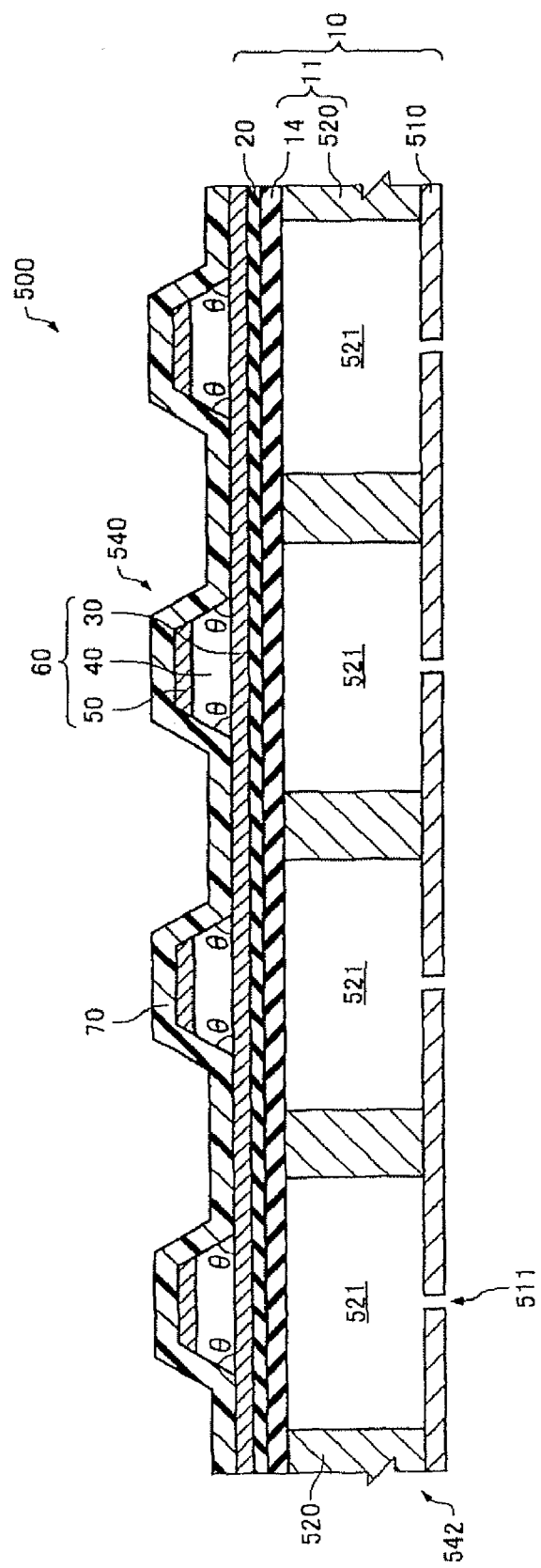
FIG. 8 is a schematic cross-sectional view of an ink jet recording head in accordance with an embodiment of the invention.
Figure 9:
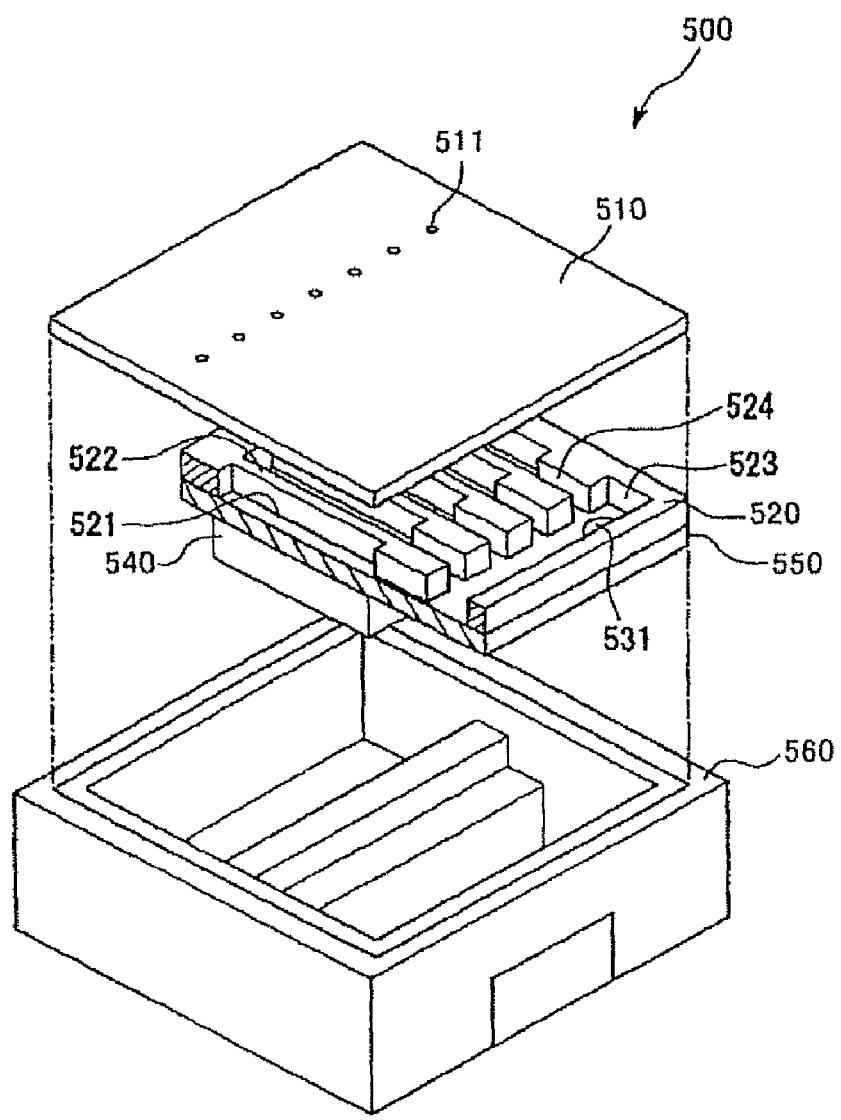
FIG. 9 is a schematic exploded perspective view of an ink jet recording head in accordance with an embodiment of the invention.

Next, an ink jet recording head using a piezoelectric element is described. FIG. 8 is a side cross-sectional view schematically showing the structure of an ink jet recording head using the piezoelectric elements 200 shown in FIG. 4. FIG. 9 is an exploded perspective view of the ink jet recording head. It is noted that FIG. 9 shows the head upside down with respect to a state in which it is normally used.

The ink jet recording head (hereafter also referred to as the "head") 500 is equipped with a head main body 542 and piezoelectric sections 540 provided above the head main body 542, as shown in FIG. 8. It is noted that each of the piezoelectric sections 540 shown in FIG. 8 includes a lower electrode 30, a piezoelectric layer 40, and an upper electrode 50. Also, the piezoelectric sections 540 may include a protection film 70 if necessary. Also, in the ink jet recording head in accordance with the present embodiment, the piezoelectric element 200 can function as a piezoelectric actuator. The piezoelectric actuator is an element having a function to move substance.

The head main body 542 corresponds to the base substrate 10 in the piezoelectric element 200, and includes an oxide layer 14, a substrate 520, a nozzle plate 510 and an elastic layer 20. The substrate 520 may be etched from its bottom side, whereby pressure generation chambers 521 can be obtained. The oxide layer 14 and the elastic layer 20 can function as an elastic film.

More specifically, the head 500 is equipped with a nozzle plate 510, an ink chamber substrate 520, an elastic film 550, and piezoelectric sections (vibration sources) 540 that are bonded to the elastic plate 550, which are housed in a base substrate 560, as shown in FIG. 9. The head 500 forms an on-demand type piezoelectric jet head.

The nozzle plate 510 is formed from, for example, a rolled plate of stainless steel or the like, and includes multiple nozzles 511 formed in a row for jetting ink droplets. The pitch of the nozzles 511 may be appropriately set according to the printing resolution.

The ink chamber substrate 520 is fixedly bonded (affixed) to the nozzle plate 510. The ink chamber substrate 520 is formed with the silicon substrate 12 described above. The ink chamber substrate 520 has a plurality of cavities (ink cavities) 521, a reservoir 523, and supply ports 524, which are defined by the nozzle plate 510, side walls (partition walls) 522 and the elastic film 550 to be described below. The reservoir 523 temporarily reserves ink that is supplied from an ink cartridge 631 (see FIG. 10). The ink is supplied from the reservoir 523 to the respective cavities 521 through the supply ports 524.

The cavity 521 is disposed for each of the corresponding nozzles 511 as shown in FIG. 9. The cavity 521 has a volume that is variable by vibrations of the elastic film 550 to be described below. The cavity 521 is formed to eject ink by the volume change.

The elastic plate 550 is disposed on the ink chamber substrate 520 on the opposite side of the nozzle plate 510. A plurality of piezoelectric sections 540 are provided on the elastic film 550 on the opposite side of the ink chamber substrate 520. A communication hole 531 that penetrates the elastic film 550 in its thickness direction is formed in the elastic film 550 at a predetermined position, as shown in FIG. 9. Ink is supplied from an ink cartridge 631 to be described below to the reservoir 523 through the communication hole 531.

Each of the piezoelectric sections 540 is electrically connected to a piezoelectric element driving circuit to be described below, and is structured to operate (vibrate, deform) based on signals of the piezoelectric element driving circuit. In other words, each of the piezoelectric sections 540 functions as a vibration source (head actuator). The elastic film 550 vibrates (warps) by vibration (warping) of the piezoelectric section 540, and functions to instantaneously increase the inner pressure of the cavity 521.

The base substrate 560 is formed from, for example, any one of various resin materials, any one of metal materials, or the like. The ink chamber substrate 520 is affixed to and supported by the base substrate 560, as shown in FIG. 9.

The ink jet recording head 500 in accordance with the present embodiment is highly reliable in has excellent piezoelectric characteristics, and is capable of effectively jetting ink, because cracks are difficult to occur in the piezoelectric sections 540. Accordingly, the nozzles 511 can be arranged with higher density, and higher resolution and faster printing become possible. Moreover, the overall size of the head can be made smaller.

6. Ink Jet Printer

Figure 10:
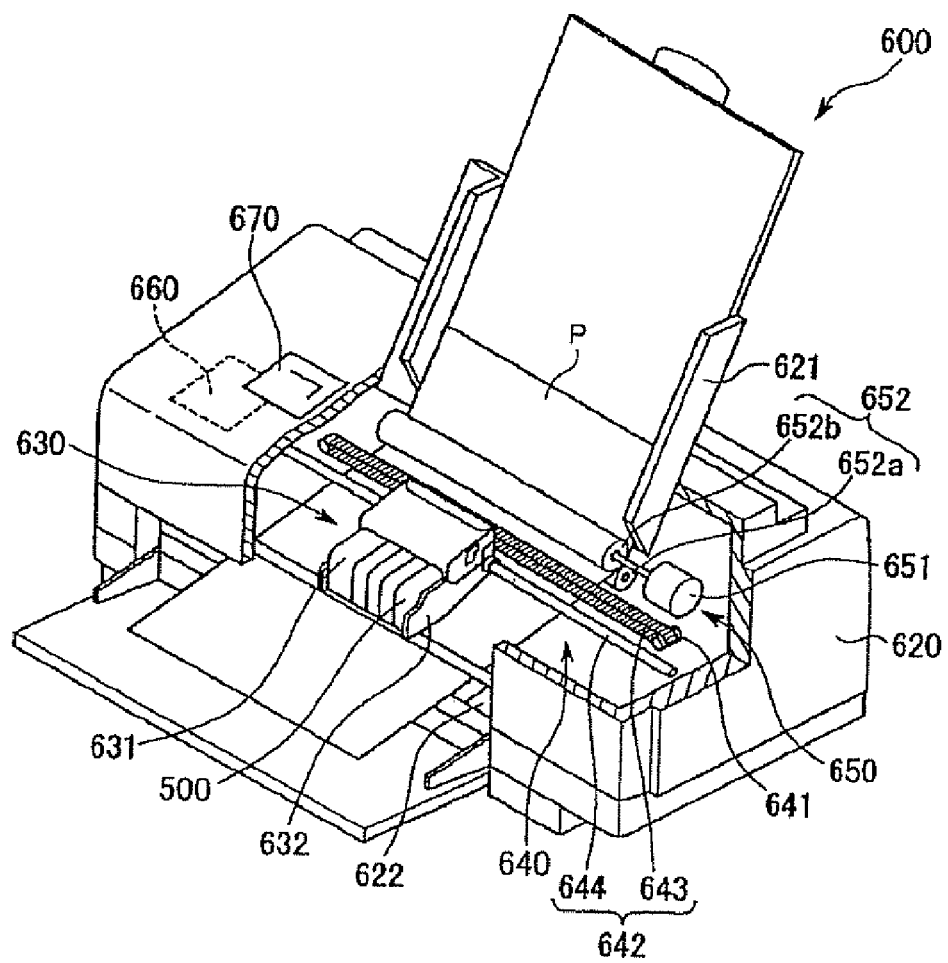
FIG. 10 is a schematic perspective view of an ink jet printer in accordance with an embodiment of the invention.

Next, an ink jet printer equipped with the aforementioned ink jet recording head 500 is described. FIG. 10 is a schematic perspective view of an ink jet printer 600 in accordance with an embodiment of the invention, in which the ink jet printer is applied to an ordinary printer for printing on paper or the like. It is noted that the upper side in FIG. 10 is referred to as an "upper section," and the lower side is referred to as a "lower section" in the following description.

The ink jet printer 600 is equipped with an apparatus main body 620, in which a tray 621 for holding recording paper P in an upper rear section thereof, a discharge port 622 for discharging the recording paper P to a lower front section thereof, and an operation panel 670 on an upper surface thereof are provided.

The apparatus main body 620 is provided on its inside, mainly, with a printing device 640 having a head unit 630 that can reciprocate, a paper feeding device 650 for feeding recording paper P one by one into the printing device 640, and a control section 660 for controlling the printing device 640 and the paper feeding device 650.

The printing device 640 is equipped with the head unit 630, a carriage motor 641 that is a driving source for the head unit 630, and a reciprocating mechanism 642 that receives rotations of the carriage motor 641 to reciprocate the head unit 630.

The head unit 630 includes the ink jet recording head 500 equipped with the aforementioned multiple nozzles 511 in its lower section, ink cartridges 631 that supply inks to the ink jet recording head 500, and a carriage 632 on which the ink jet recording head 500 and the ink cartridges 631 are mounted.

The reciprocating mechanism 642 includes a carriage guide shaft 643 having both ends thereof supported by a frame (not shown), and a timing belt 644 that extends in parallel with the carriage guide shaft 643. The carriage 632 is freely reciprocally supported by the carriage guide shaft 643, and affixed to a portion of the timing belt 644. By operations of the carriage motor 641, the timing belt 644 is moved in a positive or reverse direction through pulleys, and the head unit 630 reciprocally moves, guided by the carriage guide shaft 643. During these reciprocal movements, the ink is jetted from the ink jet recording heads 500, to print on the recording paper P.

The paper feeding device 650 includes a paper feeding motor 651 as its driving source and a paper feeding roller 652 that is rotated by operations of the paper feeding motor 651. The paper feeding roller 652 is formed from a follower roller 652a and a driving roller 652b that are disposed up and down and opposite each other with a feeding path of the recording paper P (i.e., the recording paper P) being interposed between the two rollers, and the driving roller 652b is coupled to the paper feeding motor 651.

The ink jet printer 600 in accordance with the present embodiment is equipped with the ink jet recording head 500 that is highly reliable and has high performance in which the nozzles can be arranged in high density, which makes high resolution printing and high speed printing possible.

It is noted that the ink Jet printer 600 in accordance with the present invention can also be used as a droplet discharge device that is used for industrial purposes. In this case, as ink (liquid material) to be jetted, a variety of functional materials may be used with their viscosity being appropriately adjusted by solvent, dispersion medium or the like.

7. The embodiments of the invention are described above in detail. However, those skilled in the art should readily understand that many modifications can be made without departing in substance from the novel matter and effects of the invention. Accordingly, all of such modified examples are deemed included in the scope of the invention.

Also, the piezoelectric element in accordance with the embodiment of the invention described above is applicable not only to actuators, ink jet recording heads and ink jet printers, but also to, for example, gyro devices of gyro sensors, FBAR (film bulk acoustic resonator) type or SMR (solid mounted resonator) type BAW (bulk acoustic wave) filters, ultrasound motors and the like. The piezoelectric element in accordance with the embodiment of the invention has excellent piezoelectric characteristics and is highly reliable as described above, such that it is favorably applicable in many different usages.

What is claimed is:

1. An ink jet recording head comprising:
   a pressure generation chamber;
   an elastic layer formed above the pressure generation chamber;
   a lower electrode formed on the elastic layer;
   a piezoelectric layer formed above the lower electrode;
   and an upper electrode formed above the piezoelectric layer,
   wherein the piezoelectric layer is formed in contact with a top surface of the elastic layer and a top surface of the lower electrode,
   the lower electrode has an end section that is covered by the piezoelectric layer,
   and an angle $\theta_1$ of a corner defined by a side surface of the piezoelectric layer and the top surface of the elastic layer and an angle $\theta_2$ of a corner defined by the side surface of the piezoelectric layer and the top surface of the lower electrode are both between 45° and 75°.

2. An ink jet recording head according to claim 1, further comprising a protection film that covers at least the side surface of the piezoelectric layer.

3. An ink jet recording head according to claim 2, wherein the protection film is composed of one of silicon oxide and aluminum oxide.

4. An ink jet recording head according to claim 1, wherein the angle $\theta_1$ is greater than the angle $\theta_2$ ($\theta_1 > \theta_2$).

5. An ink jet recording head according to claim 1, wherein the piezoelectric layer includes lead zirconate titanate.

6. An ink jet printer comprising the ink jet recording head recited in claim 1.

* * * * *